(12) United States Patent
Bai et al.

(10) Patent No.: US 7,705,973 B2
(45) Date of Patent: Apr. 27, 2010

(54) METHODS AND SYSTEMS FOR MONITORING STATE OF PLASMA CHAMBER

(75) Inventors: Keun-Hee Bai, Suwon-si (KR); Yong-Jin Kim, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 163 days.

(21) Appl. No.: 12/151,516

(22) Filed: May 7, 2008

(65) Prior Publication Data

US 2008/0278721 A1 Nov. 13, 2008

(30) Foreign Application Priority Data

May 10, 2007 (KR) .................... 10-2007-0045570

(51) Int. Cl.
G01J 3/443 (2006.01)
H05H 1/00 (2006.01)

(52) U.S. Cl. ........................ 356/72; 356/316

(58) Field of Classification Search .............. 356/72, 356/316
See application file for complete search history.

(56) References Cited

U.S. PATENT DOCUMENTS 5,728,253 A * 3/1998 Saito et al. ............. 156/345.25

7,328,126 B2   2/2008 Chamness
2004/0259276 A1   12/2004 Yue et al.
2005/0060103 A1   3/2005 Chamness
2007/0051470 A1   3/2007 Iwakoshi et al.

FOREIGN PATENT DOCUMENTS

| JP | 2002-168774 | 6/2002 |
|---|---|---|
| KR | 2003-0073327 A | 9/2003 |
| KR | 10-2006-0009359 | 1/2006 |
| KR | 10-2006-0123098 | 12/2006 |
| KR | 10-2007-0028204 A | 3/2007 |
| WO | WO 2004/105101 A2 | 12/2004 |

* cited by examiner

Primary Examiner—F. L Evans
(74) Attorney, Agent, or Firm—Milles & Onello, LLP (57) ABSTRACT

Provided are methods and systems for monitoring a state of a plasma chamber. In the method, an optical characteristic of plasma generated in a plasma chamber including a window is measured in a predetermined measurement wavelength band. A process status index (PSI) is extracted from the measured optical characteristic. A state of the plasma chamber is evaluated by analyzing the extracted PSI. The optical characteristic of the plasma is measured in the predetermined measurement wavelength band in which a transmittance of light passing through the window is substantially independent of a wavelength of the light.

20 Claims, 6 Drawing Sheets

METHODS AND SYSTEMS FOR MONITORING STATE OF PLASMA CHAMBER

CROSS-REFERENCE TO RELATED APPLICATION

This U.S. non-provisional patent application claims priority under 35 U.S.C. § 119 of Korean Patent Application No. 10-2007-0045570, filed on May 10, 2007, the entire contents of which are hereby incorporated by reference.

FIELD OF THE INVENTION

The present invention disclosed herein relates to plasma chamber systems and methods of operating the plasma chamber systems, and more particularly, to methods and systems for monitoring a state of a plasma chamber.

BACKGROUND

Plasma is used in etching, deposition, and sputtering processes for manufacturing semiconductors and liquid crystal displays (LCDs). More specifically, plasma is formed in a vacuum chamber (i.e., a plasma chamber) using electricity supplied in the form of a high-frequency voltage or current, and the above-mentioned processes are performed using the physical or chemical characteristics of ions of the plasma.

To satisfy certain technical demands related to integration level and performance, highly advanced techniques have been applied to the processes, resulting in changes to process conditions. However, the repeatability of the processes or product performance can be largely affected by even a small variation in process condition, and therefore, it may be necessary to monitor variations of process conditions.

However, it can be difficult to evaluate the repeatability of a process by monitoring process conditions since various process conditions can affect the repeatability of the process. For example, process conditions, such as gas flow, unintentional fluctuation, chamber memory effect, arching, and plasma instability, can affect the repeatability of the process and product performance. It can be difficult to precisely measure all of such various process conditions. In addition, it can also be difficult to predict changes of process outputs from the measurement results.

The state of a process in which plasma is used can be monitored based on the fact that the state of the process is sensitive to the state of the plasma. For example, an etch stop point can be determined by measuring variations in optical characteristics of plasma. More specifically, when a lower layer disposed beneath an etch target layer is exposed while etching the etch target layer, gas ratios and pressure of a chamber vary, and thus the intensity of light emitted from plasma can vary at a specific wavelength. The etch stop point can be determined by monitoring variations of the intensity in the light emitted from the plasma. However, this method can be used to determine only the etch stop point since the method uses light having a specific wavelength. That is, the repeatability of a process may not be properly evaluated by the method.

SUMMARY OF THE INVENTION

Embodiments of the present invention provide reliable methods of evaluating process conditions.

Embodiments of the present invention also provide reliable systems for evaluating process conditions.

Embodiments of the present invention provide methods of monitoring a plasma chamber by measuring light in a wavelength band in which a transmittance of the light is substantially independent of a wavelength of the light. The methods include measuring an optical characteristic of plasma in a predetermined measurement wavelength band, the plasma being generated in a plasma chamber including a window; extracting a process status index (PSI) from the measured optical characteristic; and evaluating a state of the plasma chamber by analyzing the extracted PSI. The optical characteristic of the plasma may be measured in the predetermined measurement wavelength band in which a transmittance of light passing through the window is substantially independent of a wavelength of the light.

In some embodiments, the optical characteristic of the plasma is measured in the predetermined measurement wavelength band in which a transmittance of light passing through the window varies in a range from about 1% to about 20% according to a wavelength of the light. For example, the measuring of the optical characteristic includes measuring light emitted from the plasma chamber and having a wavelength in a range from about 900 nm to about 1700 nm.

In other embodiments, the measuring of the optical characteristic includes measuring a spectral characteristic of light emitted from the plasma chamber and having a wavelength in a range from about 600 nm to about 3000 nm.

In still other embodiments, the predetermined measurement wavelength band is a band in which a transmittance variation of light passing through the window is substantially independent of a thickness of a by-product deposited on the window.

In even other embodiments, the extracting of the PSI includes performing an inner product of data of the optical characteristic and wavelength-weight data. The wavelength-weight data may be obtained by principal component analysis (PCA) or multi-way principal component analysis (MPCA). Prior to the performing of the inner product, the extracting of the PSI may further include normalizing intensity values of light measured in the predetermined measurement wavelength band based on an intensity value of light measured at a predetermined reference wavelength.

In yet other embodiments, the evaluating of the state of the plasma chamber includes comparing the PSI with PSI trend data providing information about a variation trend of the PSI with respect to time. The evaluating of the state of the plasma chamber may further include transmitting a signal to an operator to inform the operator of a process error when a difference between the PSI and the PSI trend data is equal to or greater than a predetermined critical value.

In further embodiments, the evaluating of the state of the plasma chamber includes disregarding a variation of the PSI caused by an intended process condition change by evaluating the variation of the PSI using condition-result data providing information about a relationship between process condition changes and variations of the PSI.

In other embodiments of the present invention, there are provided systems for monitoring a plasma chamber by analyzing light in a wavelength band in which a transmittance of the light is substantially independent of a wavelength of the light. The systems include: a measurement unit configured to measure light emitted from a plasma chamber through a window of the plasma chamber in a predetermined measurement wavelength band; a PSI extraction part configured to extract a PSI from an optical characteristic of the light; and a status decision part configured to evaluate a state of the plasma chamber by analyzing the extracted PSI. The predetermined measurement wavelength band may be a band in which a transmittance of light passing through the window is substantially independent of a wavelength of the light.

In some embodiments, the predetermined measurement wavelength band is a band in which a transmittance of light passing through the window varies in a range from about 1% to about 20% according to a wavelength of the light. For example, the predetermined measurement wavelength band may range from about 900 nm to about 1700 nm. Alternatively, the predetermined measurement wavelength band can range from about 600 nm to about 3000 nm.

In other embodiments, the predetermined measurement wavelength band is a band in which a transmittance variation of light passing through the window is substantially independent of a thickness of a by-product deposited on the window.

In still other embodiments, the PSI extraction part includes a first processing part configured to convert intensity values of light measured in the predetermined measurement wavelength band into ratios to an intensity value of light measured at a predetermined reference wavelength. The PSI extraction part may further include a second processing unit configured to calculate an inner product of wavelength-weight data and intensity values of light measured in the measurement wavelength band, wherein the wavelength-weight data are data obtained by PCA or MPCA for assigning different weights to the measured intensity values according to wavelength.

In even other embodiments, the status decision part is configured to evaluate the state of the plasma chamber by comparing the PSI with PSI trend data providing information about a variation trend of the PSI with respect to time.

In yet other embodiments, the system may further include a user interface configured to transmit a signal to an operator to inform the operator of a process error when a difference between the PSI and the PSI trend data is equal to or greater than a predetermined critical value.

In further embodiments, the status decision part is configured to disregard a variation of the PSI caused by an intended process condition change by evaluating the variation of the PSI using condition-result data providing information about a relationship between process condition changes and variations of the PSI.

BRIEF DESCRIPTION OF THE FIGURES

The accompanying figures are included to provide a further understanding of the present invention, and are incorporated in and constitute a part of this specification. The drawings illustrate exemplary embodiments of the present invention and, together with the description, serve to explain principles of the present invention. In the figures.

DETAILED DESCRIPTION OF PREFERRED EMBODIMENTS

Preferred embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art.

Figure 1:
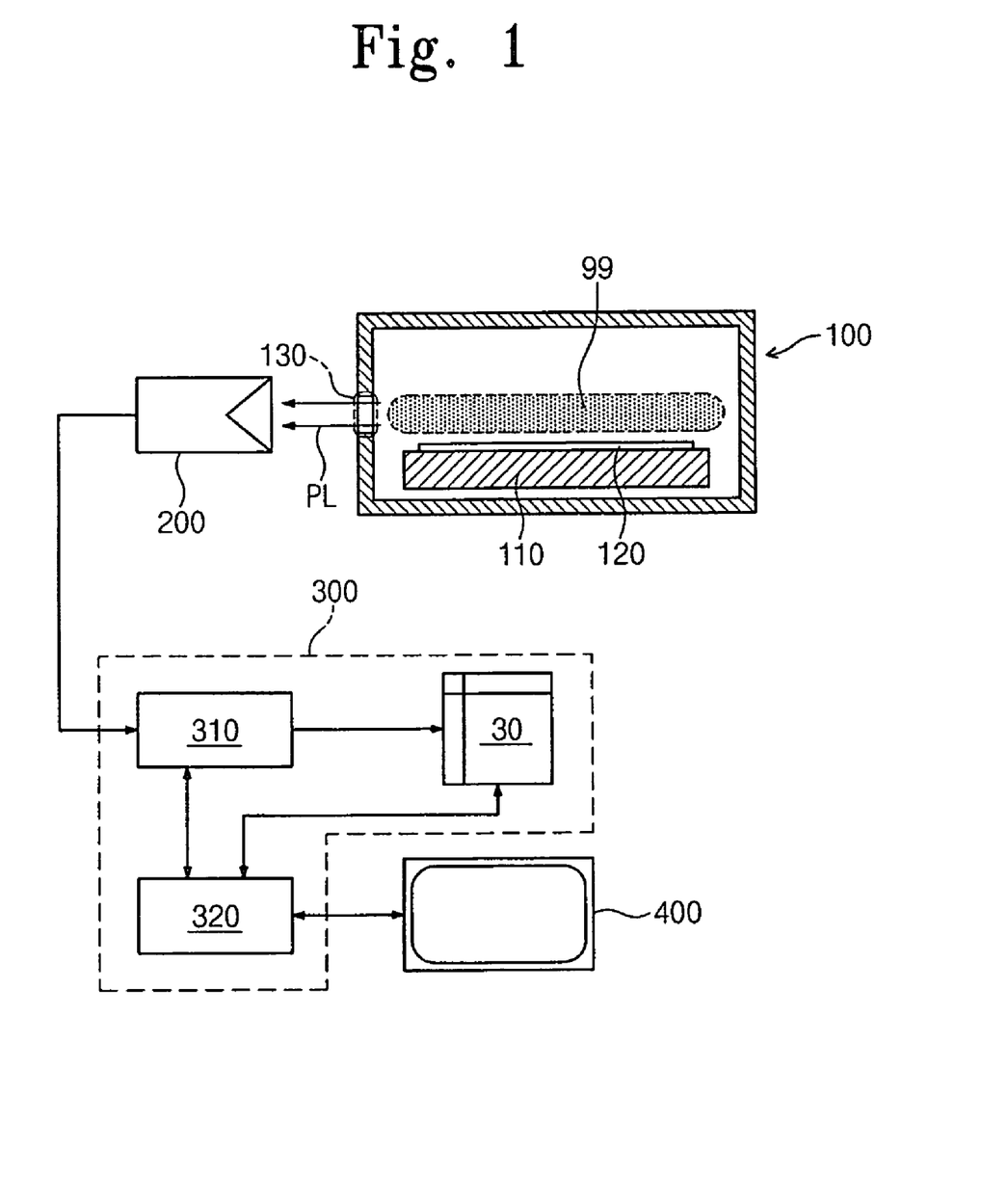
FIG. 1 is a view illustrating a system for monitoring a state of a plasma chamber according to an embodiment of the present invention.

FIG. 1 is a view illustrating a system for monitoring a state of a plasma chamber according to an embodiment of the present invention.

Referring to FIG. 1, the monitoring system for monitoring a state of a plasma chamber includes a plasma chamber 100 in which plasma 99 is generated, a measurement unit 200 configured to measure optical characteristics of light PL emitted from the plasma chamber 100, and an analysis unit 300 detecting a state of the plasma chamber 100 using the measured optical characteristics of the light PL. The plasma 99 forms above a wafer chuck 110 on which a semiconductor substrate 120 is loaded. The measurement unit 200 receives light PL emitted from the plasma 99 through a window 130 formed in a sidewall of the plasma chamber 100. The window 130 can be formed of a transparent material such as quartz and sapphire.

As shown, the plasma chamber 100 can be used as an etching chamber for etching the semiconductor substrate 120, however, the present invention is not limited thereto. For example, the plasma chamber 100 can be used as a deposition or sputtering chamber. The use of the plasma chamber 100 is not limited to semiconductor manufacturing. The plasma chamber 100 can be used in various industrial fields such as in the liquid crystal display (LCD) manufacturing industry.

The analysis unit 300 may include a process status index (PSI) extraction part 310 and a status decision part 320. The PSI extraction part 310 extracts a PSI using optical characteristics of light measured by the measurement unit 200. The status decision part 320 analyzes the PSI to detect a process state of the plasma chamber 100. The analysis unit 300 may further include a memory device 30. The memory device 30 stores PSI data and other various data used to detect the process state of the plasma chamber 100. The PSI extraction part 310 and the status decision part 320 can be hardware parts formed of electric circuits or software loaded in a computer. The PSI extraction part 310, the status decision part 320, and the memory device 30 are electrically connected to each other for data transmission. A method of extracting PSI data using the PSI extraction part 310, and a method of detecting a process state of the plasma chamber 100 using the status decision part 320 will be described in detail with reference to FIG. 2.

The monitoring system may further include a user interface 400 for alarming an operator when the status decision part 320 detects an error in the plasma chamber 100. The measurement unit 200 further includes an optical sensor that can detect light transmitted through the window 130 in a specific wavelength band where the transmittance of the light is independent of its wavelength. Hereinafter, the specific wavelength band will be referred to as a measurement wavelength band.

Figure 2:
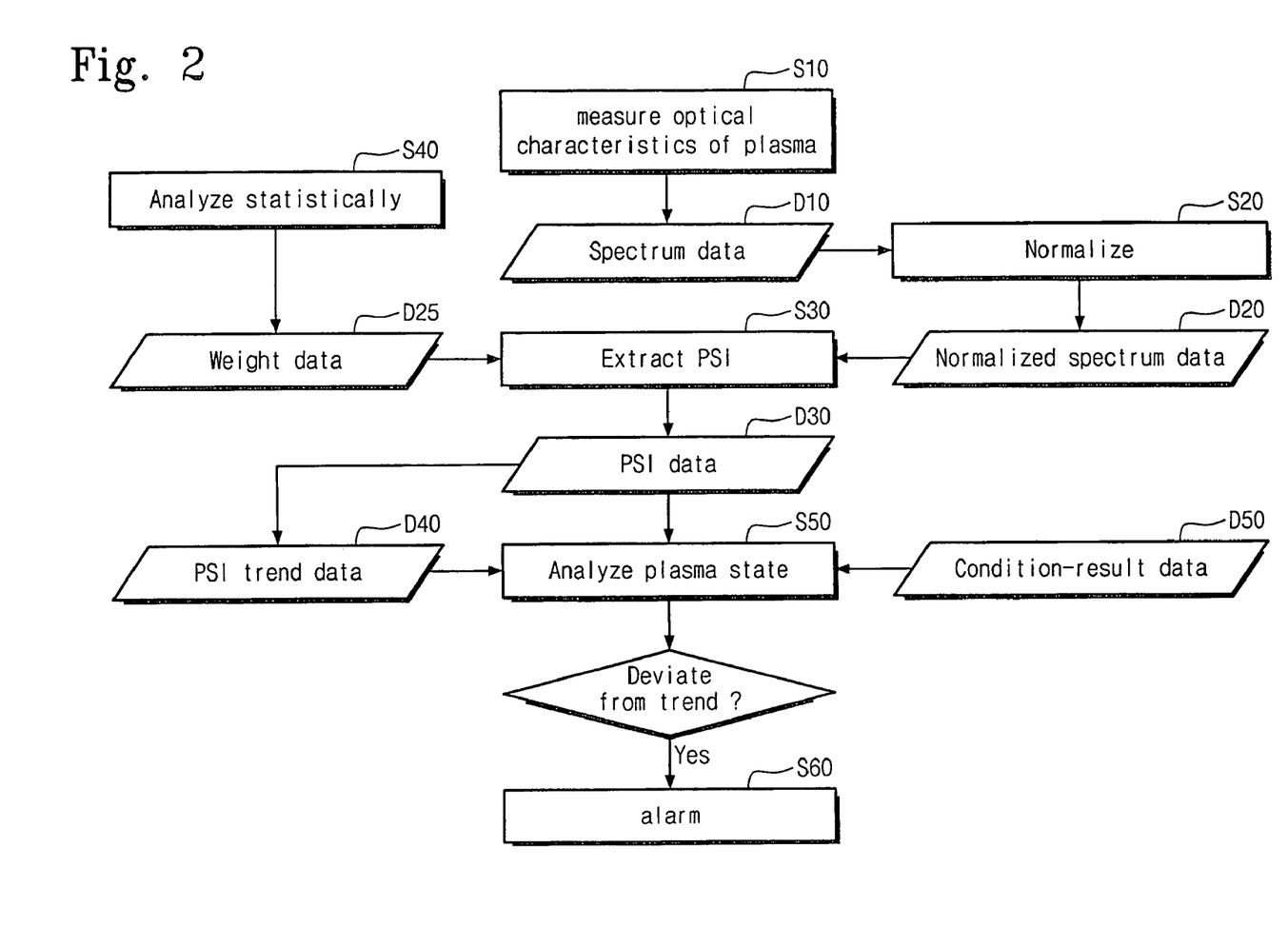
FIG. 2 is a flowchart for explaining a method of monitoring a state of a plasma chamber according to an embodiment of the present invention.

FIG. 2 is a flowchart for explaining a method of monitoring a state of a plasma chamber according to an embodiment of the present invention.

Referring to FIG. 2, a method of monitoring a state of the plasma chamber 100 includes an operation S10. In operation S10, optical characteristics of light PL emitted from the plasma chamber 100 are measured in a measurement wavelength band. The measured optical characteristics of the light PL is stored in a storage device such as the memory device 30 as spectrum data D10.

In the measurement wavelength band, the transmittance of light PL passing through the window 130 may be independent of the wavelength of the light PL. For example, in the measurement wavelength band, the transmittance of the light PL passing through the window 130 may vary within a narrow range from about 1% to about 20% according to the wavelength of the light PL. Since the intensity of the light PL after passing through the window 130 is proportional to the transmittance of the light PL through the window 130, the intensity variation of the light PL and the transmittance variation of the light PL will be interchangeably used.

Figure 8:
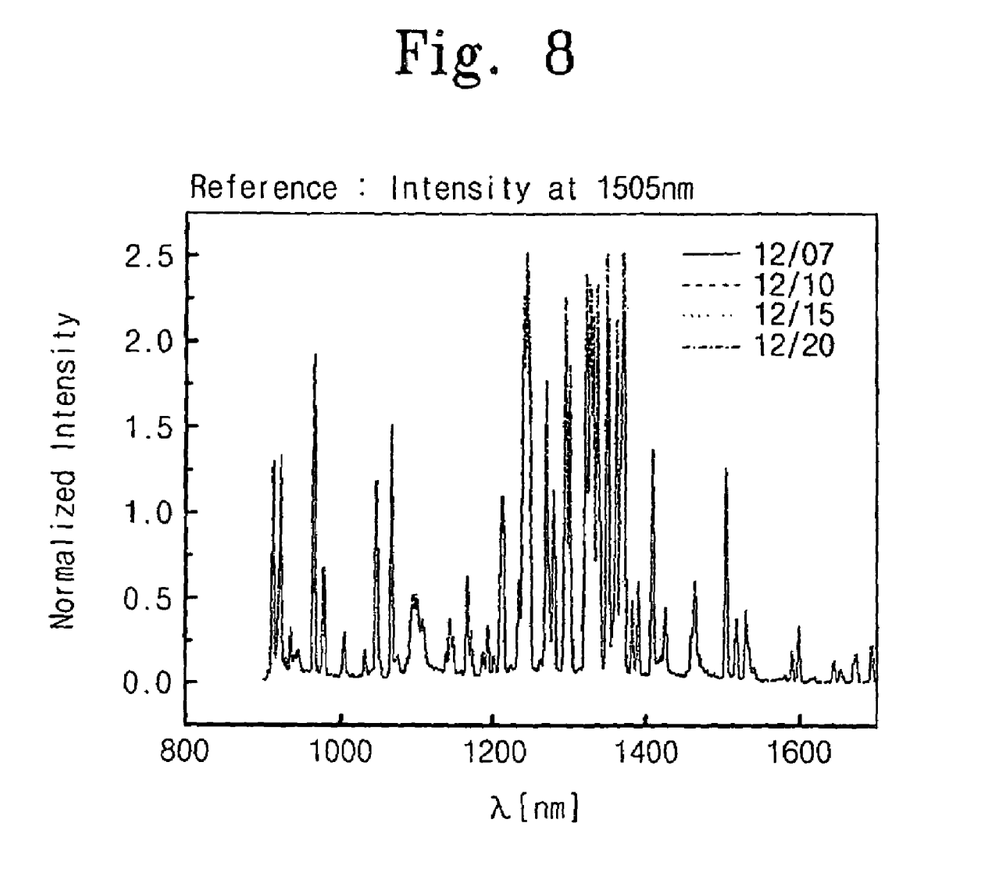
FIG. 8 is a graph for explaining advantages attained by using light having a wavelength in a measurement wavelength band according to an embodiment of the present invention.

In operation S20, the spectrum data D10 are processed to obtain normalized spectrum data D20. Through the normalization, the spectrum data D10 are expressed as ratios to an intensity value of the light PL measured at a reference wavelength. The normalized spectrum data D20 can be stored in the memory device 30. Referring to FIG. 8, exemplary normalized spectrum data are shown. The PSI extraction part 310 can perform operation S20.

In operation S30, PSI data D30 corresponding to the measured optical characteristics are prepared by extracting a PSI from the normalized spectrum data D20. The PSI data D30 can be obtained by the inner product of the normalized spectrum data D20 and predetermined weight data D25. The weight data D25 are data for assigning different weights to measured intensity values of the light PL according to the wavelength of the light PL. The weight data D25 can be prepared using a predetermined statistical method in operation S40. For example, the weight data D25 are prepared in a manner such that relatively large weights can be assigned to intensity values of the light PL measured at specific wavelengths that dominantly influence a process in the plasma chamber 100. For this, the weight data D25 can be obtained by an analysis method such as principal component analysis (PCA) and multi-way principal component analysis (MPCA). The PSI extraction part 310 can perform operation S30.

In operation S50, the state of the plasma chamber 100 is analyzed using the PSI data D30. In operation S50, predetermined PSI trend data D40 and predetermined condition-result data D50 can be used to determine whether the state of the plasma chamber 100 deviates from a PSI trend. For example, if a variation between the PSI data D30 and the PSI trend data D40 is equal to or larger than a critical value, it can be determined that the process performed in the plasma chamber 100 is under conditions not guaranteeing process repeatability. In this case, in operation S60, a predetermined alarming signal can be generated using a predetermined user interface such as the user interface 400 to report generation of a process error.

The PSI trend data D40 can be obtained by accumulating sets of PSI data D30 derived from different measurement results. The condition-result data D50 can be empirical or theoretical data indicating a relationship between process condition variations and the PSI data D30. The condition-result data D50 are used to determine whether a difference between the PSI data D30 and the PSI trend data D40 is a result of a process condition variation.

More specifically, in operation S50, when it is analyzed and determined, using the condition-result data D50, that a difference between the PSI data D30 and the PSI trend data D40 is a result of a process condition variation, it is considered that the PSI data D30 has not deviated from a PSI trend. For example, in an etch process using oxygen, the condition-result data D50 can be empirical data indicating a relationship between oxygen flowrate variation and pattern width variation. If a PSI data variation is a result of an intended oxygen flowrate variation in the etch process, the PSI data variation is not due to faults of the etch process. Therefore, in this example, it is considered that the PSI data has not deviated from a PSI trend.

As explained above, when the condition-result data D50 are used to evaluate the state of the plasma chamber 100, a process can be smoothly performed in the plasma chamber 100 without unintended interruptions caused by false alarms. The status decision part 320 can perform operations S50 and S60.

Figure 3A:
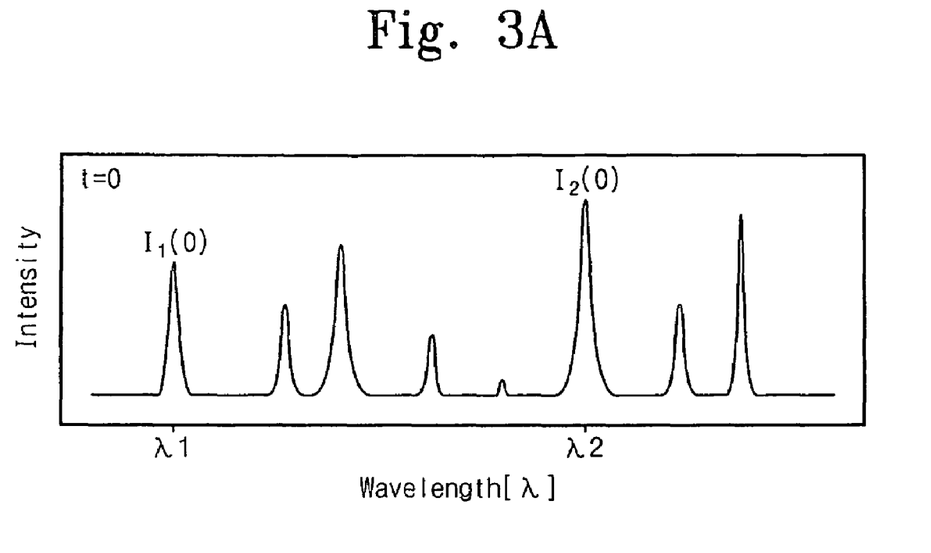
FIGS. 3A and 3B are experimental graphs showing transmittance characteristics of visible light.
Figure 3B:
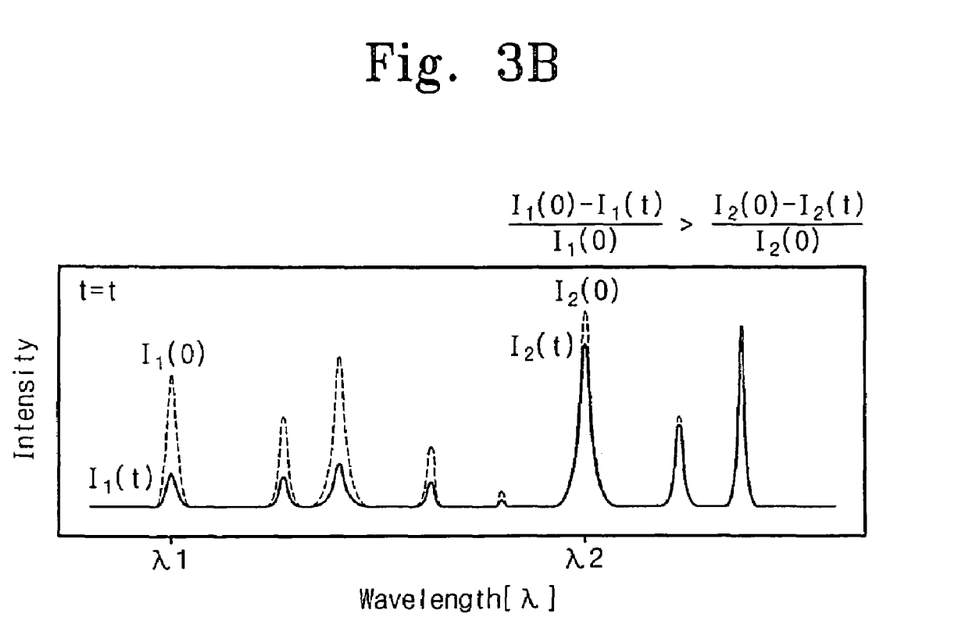

FIGS. 3A and 3B are experimental graphs showing transmittance characteristics of visible light. In detail, referring to FIGS. 3A and 3B, the transmittance of the visible light decreases with time, and the decrease is dependent on wavelength. Initial spectral characteristics of the visible light shown in FIG. 3A vary with time as shown in FIG. 3B. In FIGS. 3A and 3B, the horizontal axis denotes wavelength of visible light, and the vertical axis denotes measured intensity of the visible light.

Referring to FIGS. 3A and 3B, the intensity of light PL measured after the light PL passes through the window 130 (refer to FIG. 1) has peak values at several wavelengths. However, the peak values decrease with time. It can be believed that the decrease of the intensity in the light PL is a result of process by-products such as polymer particles attached to the window 130.

Referring to FIG. 3B, the decreased amounts of the peak values are different according to the wavelength of the light PL. For example, at an initial time (t=0), intensity peak values of the light PL are $I_1(0)$ and $I_2(0)$ at wavelengths $\lambda_1$ and $\lambda_2$, respectively. However, at a time t=t, the intensity peak values $I_1(0)$ and $I_2(0)$ of the light PL at wavelengths $\lambda_1$ and $\lambda_2$ are reduced to $I_1(t)$ and $I_2(t)$, respectively. Here, a decrease rate at the shorter wavelength $$\lambda_1 \frac{I_1(0) - I_1(t)}{I_1(0)}$$

is greater than a decrease rate at the longer wavelength $$\lambda_2 \frac{I_2(0) - I_2(t)}{I_2(0)}.$$

That is, when visible light PL passes through the window 130, the transmittance of the visible light PL varies according to the wavelength of the visible light PL.

Figure 4:
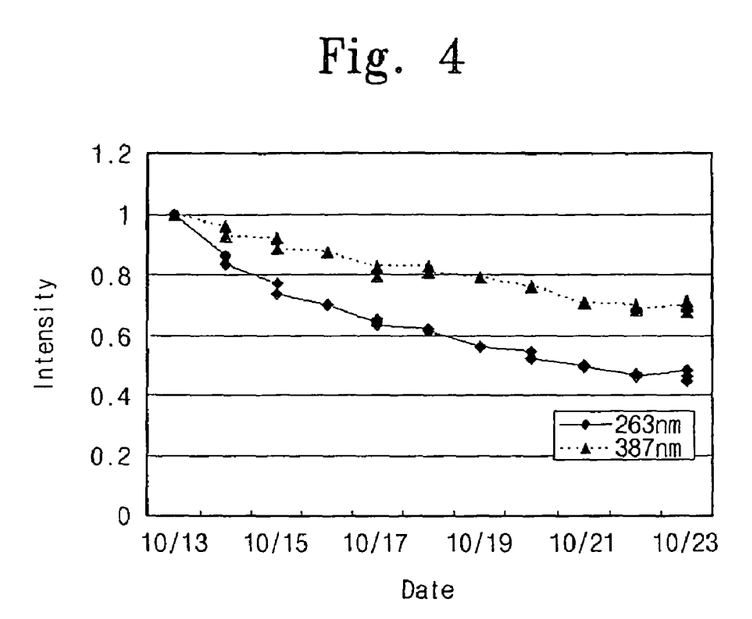
FIG. 4 is another experimental graph showing transmittance characteristics of visible light.

FIG. 4 is another experimental graph showing transmittance characteristics of visible light. In detail, referring to FIG. 4, the transmittance of light decreases with time, and the decrease is dependent on wavelength. In the experiments summarized in FIG. 4, the transmittance of 263-nm light and the transmittance of 387-nm light were measured over a predetermined period of days. In FIG. 4, the horizontal axis denotes date, and the vertical axis denotes intensity of light.

Referring to FIG. 4, the intensity value of the 263-nm light measured on October 23rd is less than the intensity value of the 263-nm light measured on October 13th by about 50%. The intensity value of the 387-nm light measured on October 23rd is less than the intensity value of the 387-nm light measured on October 13th by about 30%. These experimental results show that the time-dependent decrease in the intensity of the 387-nm light is less than that time-dependent decrease in the intensity of the 263-nm light. The transmittance of visible light is wavelength-dependent and can decrease with time by about 30% to about 50%.

The relationship between wavelength and transmittance variation of light can be explained by the Cauchy equation, which is known to be useful for at least visible light. According to the Cauchy equation, a relationship between index of refraction and wavelength can be expressed as follows:

$$n = 1 + A\left(1 + \frac{B}{\lambda^2}\right)$$

where n denotes an index of refraction, A denotes a coefficient of refraction, B denotes a coefficient of dispersion, and $\lambda$ denotes a wavelength.

The variation rate of the refractive index decreases as the wavelength increases, as can be understood by the following equation:

$$\frac{dn}{d\lambda} = \frac{-2AB}{\lambda^3}.$$

Since the transmittance of light passing through the window 130 can be expressed as a function of refractive index, it follows that the variation rate of transmittance decreases as wavelength increases, from the equation showing that the variation rate of the refractive index decreases as wavelength increases. This conclusion may be helpful to understand the experimental results shown in FIGS. 3A, 3B, and 4.

Figure 5:
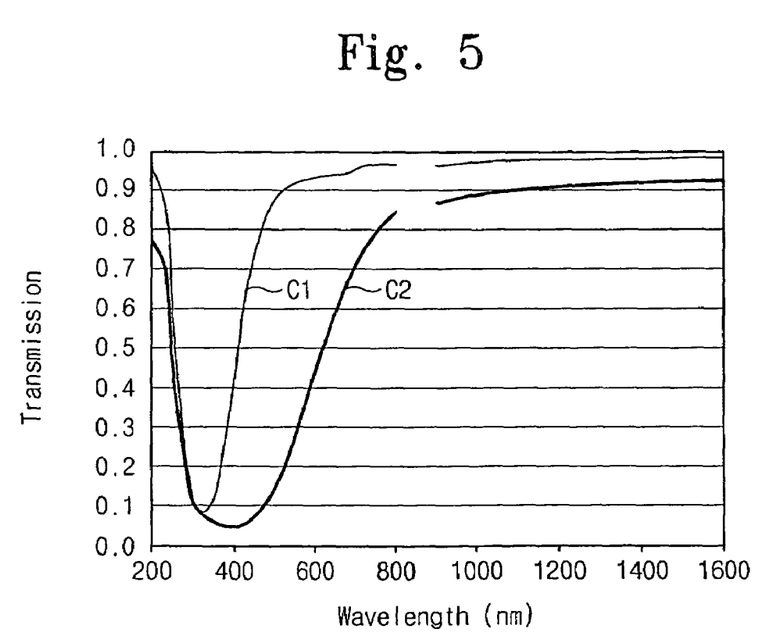
FIG. 5 is an experimental graph showing a relationship between transmittance and wavelength of light passing through a window.

FIG. 5 is an experimental graph showing a relationship between transmittance and wavelength of light passing through a window 130. The experiment was performed while varying the thickness of by-products deposited on the window. In FIG. 5, a curve C1 was obtained when substantially no by-product was deposited on the window 130, and a curve C2 was obtained when by-products were deposited on the window approximately to an allowable thickness limit level. In FIG. 5, the horizontal axis denotes wavelength of light, and the vertical axis denotes transmittance of the light.

Referring to the curve C1 of FIG. 5, in a wavelength band from about 200 nm to about 500 nm, the transmittance of light varies suddenly. However, in a wavelength band greater than about 500 nm, the transmittance of light varies little.

Referring to the curve C2 of FIG. 5, in a wavelength band from about 200 nm to about 900 nm, the transmittance of light varies suddenly. However, in a wavelength band greater than about 900 nm, the transmittance of light varies negligibly.

It can be understood from the experimental results shown in FIG. 5 that a wavelength band from about 900 nm to about 1700 nm can be the above-described measurement wavelength band where the transmittance of light passing through a window is independent of the wavelength of the light. That is, the measurement wavelength band can range from about 900 nm to about 1700 nm.

However, the measurement wavelength band can vary according to factors such as a window material, process conditions, and plasma chamber structure. Thus, the measurement wavelength band can range from about 600 nm to about 3000 nm.

In addition, other wavelength bands can be used as the measurement wavelength band. The measurement wavelength band is not limited to the range of about 900 nm to 1700 nm or the range of about 600 nm to about 3000 nm. In other words, although the experimental results shown in FIGS. 3A, 3B, 4, and 5 indicate that the wavelength range of about 200 nm to about 500 nm is not included in the measurement wavelength band, other wavelength bands such as ultraviolet band, far-infrared band, and infrared band can be fully or partially used as the measurement wavelength band if the transmittance of light passing through a window is wavelength-independent in those bands. That is, such wavelength bands can also be used as the measurement wavelength band if they satisfy certain conditions.

Figure 6:
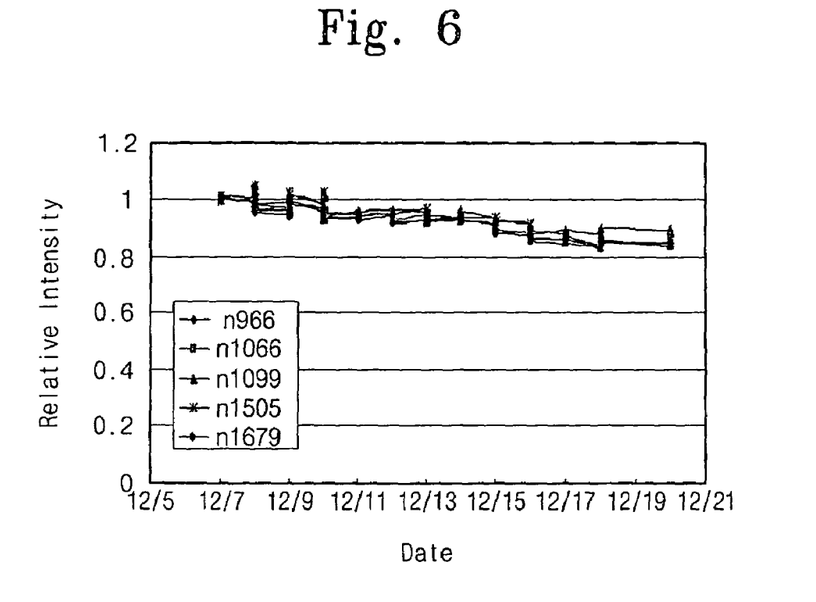
FIGS. 6 and 7 are experimental graphs showing transmittance characteristics of light in a measurement wavelength band of an embodiment of the present invention.

FIG. 6 is an experimental graph showing transmittance characteristics of light in a measurement wavelength band of an embodiment of the present invention. More specifically, FIG. 6 is an experimental graph showing how the transmittance of light varies with time in a measurement wavelength band. In the experiment summarized in FIG. 6, 966-nm light, 1066-nm light, 1099-nm light, 1505-nm light, and 1679-nm light are used. In FIG. 6, the horizontal axis denotes date, and the vertical axis denotes relative intensity of light.

Referring to FIG. 6, the intensity of light decreases with time regardless of wavelength. However, the decrease of the light intensity for thirteen days is small at about 15%. The intensity decrease rate of the light in the measurement wavelength band is much smaller than the intensity decrease rates of the 263-nm light and the 387-nm light shown in FIG. 4 (about 30% to 50% for ten days).

In addition, the intensity decrease rate of light is substantially wavelength-independent in the measurement wavelength band. For example, the intensity of the 966-nm light decreases with time at substantially the same rate as the intensity of the 1673-nm light. Meanwhile, as explained above, the intensity of light varies with time since the amount of by-products deposited on the window 130 (refer to FIG. 1) increases with time. However, the intensity decrease rate of light is relatively constant in the measurement wavelength band regardless of the thickness of the by-products accumulated on the window 130. That is, in the measurement wavelength band, the decrease rate of the transmittance of light passing through the window 130 may be substantially independent of the thickness of the by-products accumulated on the window 130.

Figure 7:
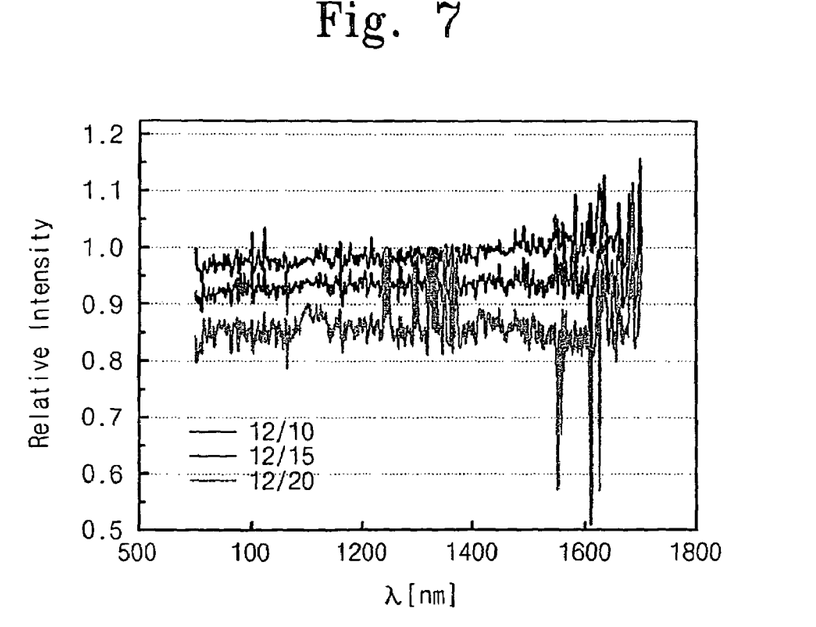

FIG. 7 is another experimental graph showing transmittance characteristics of light in a measurement wavelength band of an embodiment of the present invention. More specifically, the experimental results summarized in FIG. 7 show that the intensity of light varies in a measurement wavelength band independently of the wavelength of the light. In the experiment, the relative intensity of light was measured on December 10th, 15th, and 20th in a wavelength range from about 900 nm to about 1700 nm.

Referring to FIG. 7, the intensity of the spectra decreases with time like the case of FIG. 6. However, the shapes of the spectra do not vary with dates of measurement. In other words, the transmittance of light in the wavelength band of about 900 nm to about 1700 nm is slightly dependent on time but is independent on wavelength. That is, the wavelength range of about 900 nm to about 1700 nm satisfies the above-described requirements for a measurement wavelength band.

FIG. 8 is a graph for explaining advantages attained by using light having a wavelength in a measurement wavelength band according to an embodiment of the present invention. More specifically, the graph of FIG. 8 is obtained by normalizing the spectra of FIG. 7 based on the intensity of 1505-nm light measured on December 7th.

Referring to FIG. 8, when spectra measured on different dates are normalized, the normalized spectra have substantially the same profile and thus are almost indistinguishable.

As explained in FIG. 2, PSI data D30 are derived from normalized spectrum data D20. That is, since the normalized spectra (data) are substantially the same as shown in FIG. 8, PSI data D30 derived from the normalized spectrum data are reliable. Therefore, the state of a plasma chamber can be precisely evaluated using the PSI data D30.

The advantages of the embodiments described herein are attained by sensing light emitted from a plasma chamber in a predetermined wavelength band (i.e., a measurement wavelength band) where the transmittance of the light is independent of the wavelength of the light. Furthermore, the advantages are attained by normalizing measured spectrum data to remove the effect of a time-dependent decrease of the transmittance of the light.

As described above, the state of a plasma chamber is checked by sensing light emitted from a plasma chamber in a predetermined wavelength band (i.e., a measurement wavelength band) where the transmittance of the light is independent of the wavelength of the light. When the transmittance of light is independent of the wavelength of the light, although the intensity of the light decreases with time, the decrease rate is substantially constant and independent of the wavelength of the light. Therefore, although contamination of a window increases with time, the state of the plasma chamber can be reliably evaluated.

Furthermore, according to embodiments of the present invention, spectra are measured in a wavelength band where the transmittance of light is independent of the wavelength of the light. Then, the spectra are normalized, and the state of the plasma chamber is evaluated using the normalized spectra. As explained above, in the wavelength band where the transmittance of light is independent of the wavelength of the light, a decrease rate of the intensity of the light is substantially constant and independent of the wavelength of the light. Thus, the effect of the time-dependent decrease of the intensity of the light is not included in the normalized spectra as shown in FIG. 8. As a result, the state of the plasma chamber can be reliably monitored and evaluated although contamination of the window can increase with time.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method of monitoring a plasma chamber, comprising:
   measuring an optical characteristic of plasma in a predetermined measurement wavelength band, the plasma being generated in the plasma chamber including a window;
   extracting a process status index (PSI) from the measured optical characteristic; and
   evaluating a state of the plasma chamber by analyzing the extracted PSI,
   wherein the optical characteristic of the plasma is measured in the predetermined measurement wavelength band in which a transmittance of light passing through the window is substantially independent of a wavelength of the light.

2. The method of claim 1, wherein the optical characteristic of the plasma is measured in the predetermined measurement wavelength band in which a transmittance of light passing through the window varies in a range from about 1% to about 20% according to a wavelength of the light.

3. The method of claim 1, wherein the measuring of the optical characteristic comprises measuring light emitted from the plasma chamber, the light having a wavelength in a range from about 900 nm to about 1700 nm.

4. The method of claim 1, wherein the measuring of the optical characteristic comprises measuring a spectral characteristic of light emitted from the plasma chamber in a range of wavelength from about 600 nm to about 3000 nm.

5. The method of claim 1, wherein the predetermined measurement wavelength band is a band in which a transmittance variation of light passing through the window is substantially independent of a thickness of a by-product deposited on the window.

6. The method of claim 1, wherein the extracting of the PSI comprises performing an inner product of data of the optical characteristic and wavelength-weight data, wherein the wavelength-weight data are obtained by principal component analysis (PCA) or multi-way principal component analysis (MPCA).

7. The method of claim 6, wherein the extracting of the PSI further comprises normalizing intensity values of light measured in the predetermined measurement wavelength band based on an intensity value of light measured at a predetermined reference wavelength, prior to the performing of the inner product.

8. The method of claim 1, wherein the evaluating of the state of the plasma chamber comprises comparing the PSI with PSI trend data to provide information about a variation trend of the PSI with respect to time.

9. The method of claim 8, wherein the evaluating of the state of the plasma chamber further comprises transmitting a signal to an operator to inform the operator of a process error when a difference between the PSI and the PSI trend data is equal to or greater than a predetermined critical value.

10. The method of claim 9, wherein the evaluating of the state of the plasma chamber comprises disregarding a variation of the PSI caused by an intended process condition change by evaluating the variation of the PSI using condition-result data providing information about a relationship between process condition changes and variations of the PSI.

11. A system for monitoring a plasma chamber, comprising:
    a measurement unit configured to measure light emitted from the plasma chamber through a window of the plasma chamber in a predetermined measurement wavelength band;
    a process status index (PSI) extraction part configured to extract a PSI from an optical characteristic of the light; and
    a status decision part configured to evaluate a state of the plasma chamber by analyzing the extracted PSI,
    wherein the predetermined measurement wavelength band is a band in which a transmittance of light passing through the window is substantially independent of a wavelength of the light.

12. The system of claim 11, wherein the predetermined measurement wavelength band is a band in which a transmittance of light passing through the window varies in a range from about 1% to about 20% according to a wavelength of the light.

13. The system of claim 12, wherein the predetermined measurement wavelength band ranges from about 900 nm to about 1700 nm.

14. The system of claim 11, wherein the predetermined measurement wavelength band ranges from about 600 nm to about 3000 nm.

15. The system of claim 11, wherein the predetermined measurement wavelength band is a band in which a transmittance variation of light passing through the window is substantially independent of a thickness of a by-product deposited on the window.

16. The system of claim 11, wherein the PSI extraction part comprises a first processing part configured to convert intensity values of light measured in the predetermined measurement wavelength band into ratios to an intensity value of light measured at a predetermined reference wavelength.

17. The system of claim 16, wherein the PSI extraction part further comprises a second processing unit configured to calculate an inner product of wavelength-weight data and intensity values of light measured in the measurement wavelength band, wherein the wavelength-weight data are data obtained by principal component analysis (PCA) or multi-way principal component analysis (MPCA) for assigning different weights to the measured intensity values according to wavelength.

18. The system of claim 11, wherein the status decision part is configured to evaluate the state of the plasma chamber by comparing the PSI with PSI trend data providing information about a variation trend of the PSI with respect to time.

19. The system of claim 18, further comprising a user interface configured to transmit a signal to an operator to inform the operator of a process error when a difference between the PSI and the PSI trend data is equal to or greater than a predetermined critical value.

20. The system of claim 19, wherein the status decision part is configured to disregard a variation of the PSI caused by an intended process condition change by evaluating the variation of the PSI using condition-result data providing information about a relationship between process condition changes and variations of the PSI.

* * * * *